(12) United States Patent
Kucheravy

(10) Patent No.: US 10,110,336 B2
(45) Date of Patent: Oct. 23, 2018

(54) DETERMINING AMBIENT NOISE IN A DEVICE UNDER TEST ELECTROMAGNETIC COMPATIBILITY TEST ENVIRONMENT

(71) Applicant: The DIRECTV Group, Inc., El Segundo, CA (US)

(72) Inventor: William Kucheravy, Granada Hills, CA (US)

(73) Assignee: THE DIRECTV GROUP, INC., El Segundo, CA (US)

( * ) Notice: Subject to any disclaimer, the term of this patent is extended or adjusted under 35 U.S.C. 154(b) by 6 days.

(21) Appl. No.: 15/217,577

(22) Filed: Jul. 22, 2016

(65) Prior Publication Data
US 2018/0026737 A1    Jan. 25, 2018

(51) Int. Cl.
*H04J 11/00* (2006.01)
*H04L 1/24* (2006.01)
(Continued)

(52) U.S. Cl.
CPC .......... *H04J 11/0023* (2013.01); *H04L 1/242* (2013.01); *H04L 1/248* (2013.01);
(Continued)

(58) Field of Classification Search
CPC ............ G01R 31/31709; G01R 31/002; G01R 29/26; G01R 29/0814; G01R 31/001
(Continued)

(56) References Cited

U.S. PATENT DOCUMENTS 3,325,644 A * 6/1967 Frye .......................... H03F 1/54
250/338.1
5,291,426 A   3/1994 Collins et al.
(Continued)

FOREIGN PATENT DOCUMENTS

CA      2599535 A1   9/2006
CN    102594473 A    7/2012
(Continued)

OTHER PUBLICATIONS

Frech, Arnd, and Peter Russer. "Real-time ambient noise cancellation for EMI measurements on open area test sites." Electromagnetic Compatibility (APEMC), 2012 Asia-Pacific Symposium on. IEEE, 2012.*
(Continued)

*Primary Examiner* — Christopher McAndrew
(74) *Attorney, Agent, or Firm* — Amin, Turocy & Watson, LLP

(57) ABSTRACT

Determining ambient noise in a device under test electromagnetic compatibility test environment is presented herein. A method can include determining, by a system comprising a processor via a radio frequency input port of the system, an ambient electromagnetic noise corresponding to the system; and in response to determining, by the system via the radio frequency input port, a radio frequency signature of a device under test, subtracting, by the system, the ambient electromagnetic noise from the radio frequency signature to obtain a normalized value representing an electromagnetic emission of the device under test. In an example, an antenna/coaxial cable has been connected to the radio frequency input port, the ambient electromagnetic noise can be determined using the antenna/coaxial cable, and a radiated/conducted electromagnetic characteristic of the device under test representing the radio frequency signature of the device
(Continued)

under test can be determined using the antenna/coaxial cable.

20 Claims, 12 Drawing Sheets

(51) Int. Cl.
*G01R 31/00* (2006.01)
*G01R 29/26* (2006.01)
*G01R 29/08* (2006.01)
*G01R 31/317* (2006.01)

(52) U.S. Cl.
CPC .......... *G01R 29/0814* (2013.01); *G01R 29/26* (2013.01); *G01R 31/001* (2013.01); *G01R 31/002* (2013.01); *G01R 31/31709* (2013.01)

(58) Field of Classification Search
USPC ........................................................ 324/613
See application file for complete search history.

(56) References Cited

U.S. PATENT DOCUMENTS

| | | | |
|---|---|---|---|
| 5,714,888 A | 2/1998 | Naujoks | |
| 5,749,047 A * | 5/1998 | Cabot | G01R 23/20 324/76.19 |
| 5,970,429 A | 10/1999 | Martin | |
| 6,097,820 A | 8/2000 | Turner | |
| 6,118,529 A | 9/2000 | Spragg | |
| 6,137,992 A * | 10/2000 | Mohan | H04B 17/20 455/226.1 |
| 6,263,289 B1 | 7/2001 | Hassun et al. | |
| 6,331,782 B1 | 12/2001 | White et al. | |
| 6,836,742 B2 | 12/2004 | Brekenfeld | |
| 6,943,353 B2 | 9/2005 | Elmore et al. | |
| 6,970,247 B2 | 11/2005 | Yankielun | |
| 7,092,832 B2 | 8/2006 | Brown | |
| 7,332,360 B2 | 2/2008 | Smayling et al. | |
| 7,464,005 B1 | 12/2008 | Beetner et al. | |
| 7,515,094 B2 | 4/2009 | Keller, III | |
| 7,551,965 B2 * | 6/2009 | Bange | A61N 1/37211 607/60 |
| 7,839,153 B2 * | 11/2010 | Joy | G01D 21/00 324/601 |
| 8,422,885 B2 | 4/2013 | Adhikari et al. | |
| 8,537,050 B2 | 9/2013 | Freeman et al. | |
| 8,786,293 B1 | 7/2014 | Tsironis | |
| 8,912,804 B2 * | 12/2014 | Olgaard | G01R 31/2841 324/633 |
| 9,172,476 B2 | 10/2015 | Nguyen et al. | |
| 2002/0087199 A1 * | 7/2002 | Bange | A61N 1/37211 607/27 |
| 2005/0234329 A1 * | 10/2005 | Kraus, Jr. | A61B 5/04004 600/409 |
| 2005/0267689 A1 | 12/2005 | Tsypin | |
| 2006/0142821 A1 * | 6/2006 | Bange | A61N 1/37211 607/60 |
| 2006/0200344 A1 * | 9/2006 | Kosek | G10L 21/0208 704/226 |
| 2010/0123453 A1 | 5/2010 | Pauly et al. | |
| 2012/0194386 A1 * | 8/2012 | Mussler | H01Q 1/28 342/374 |
| 2013/0064382 A1 * | 3/2013 | Stelliga | H04B 15/00 381/71.1 |
| 2013/0197848 A1 | 8/2013 | Sariaslani et al. | |
| 2013/0234728 A1 * | 9/2013 | Olgaard | G01R 31/001 324/633 |
| 2013/0311141 A1 | 11/2013 | Peng et al. | |
| 2014/0044266 A1 | 2/2014 | Kim et al. | |

FOREIGN PATENT DOCUMENTS

| | | |
|---|---|---|
| CN | 102944757 A | 2/2013 |
| EP | 0623816 A2 | 11/1994 |
| GB | 2310933 A | 9/1997 |
| JP | 10150406 A | 6/1998 |
| WO | 9207275 A1 | 4/1992 |
| WO | 2002012907 A2 | 2/2002 |
| WO | 2011020148 A1 | 2/2011 |

OTHER PUBLICATIONS

Lu et al., "A New Radiation Emission Test Method Based on Array Signal Processing Technology", Jul. 2014, 8 pages.
Chhikara et al., "Noise Cancellation Using Adaptive Algorithms", International Journal of Modern Engineering Research (IJMER), 2012, pp. 792-795, vol. 2, Issue 3.
Nicolae et al., "Noise Canceling in Audio Signal with Adaptive Filter", Acta Electrotehnica, University of Oradea, 2004, pp. 599-602, vol. 45, Issue 6, Romania.
Awan et al., "Performance Evaluation of Open Space Interference Cancellation Model in EMC Measurement", Science International (Lahore), 2014, pp. 503-506, vol. 26, Issue 1.

* cited by examiner

DETERMINING AMBIENT NOISE IN A DEVICE UNDER TEST ELECTROMAGNETIC COMPATIBILITY TEST ENVIRONMENT

TECHNICAL FIELD

The subject disclosure generally relates to embodiments for determining ambient noise in a device under test (DUT) electromagnetic compatibility (EMC) test environment.

BACKGROUND

Electromagnetic interference (EMI) can affect an electrical circuit via unintentional electromagnetic induction, electrostatic coupling, and/or conduction. In this regard, natural and/or man-made sources of electrical disturbances can generate changes in electrical current and voltage that can cause EMI, e.g., via conducted and/or radiated emissions. EMC testing can be used to determine conducted and/or radiated emissions caused by a DUT in order to limit EMI affecting other devices, consumer devices, etc.

Although conventional EMI testing technologies can determine whether a DUT satisfies various EMC testing criteria, e.g., not generating more than −116 dB of conducted and/or radiated emissions at frequencies between 475 MHz and 625 MHz, such technologies utilize specialized DUT testing environments comprising Faraday cages, shields, grounded test rooms including anechoic materials, etc. to prevent external electromagnetic events from affecting DUT measurements. Consequently, conventional EMI testing technologies have had some drawbacks, some of which may be noted with reference to the various embodiments described herein below.

BRIEF DESCRIPTION OF THE DRAWINGS

Non-limiting embodiments of the subject disclosure are described with reference to the following figures, wherein like reference numerals refer to like parts throughout the various views unless otherwise specified.

DETAILED DESCRIPTION

Figure 1:
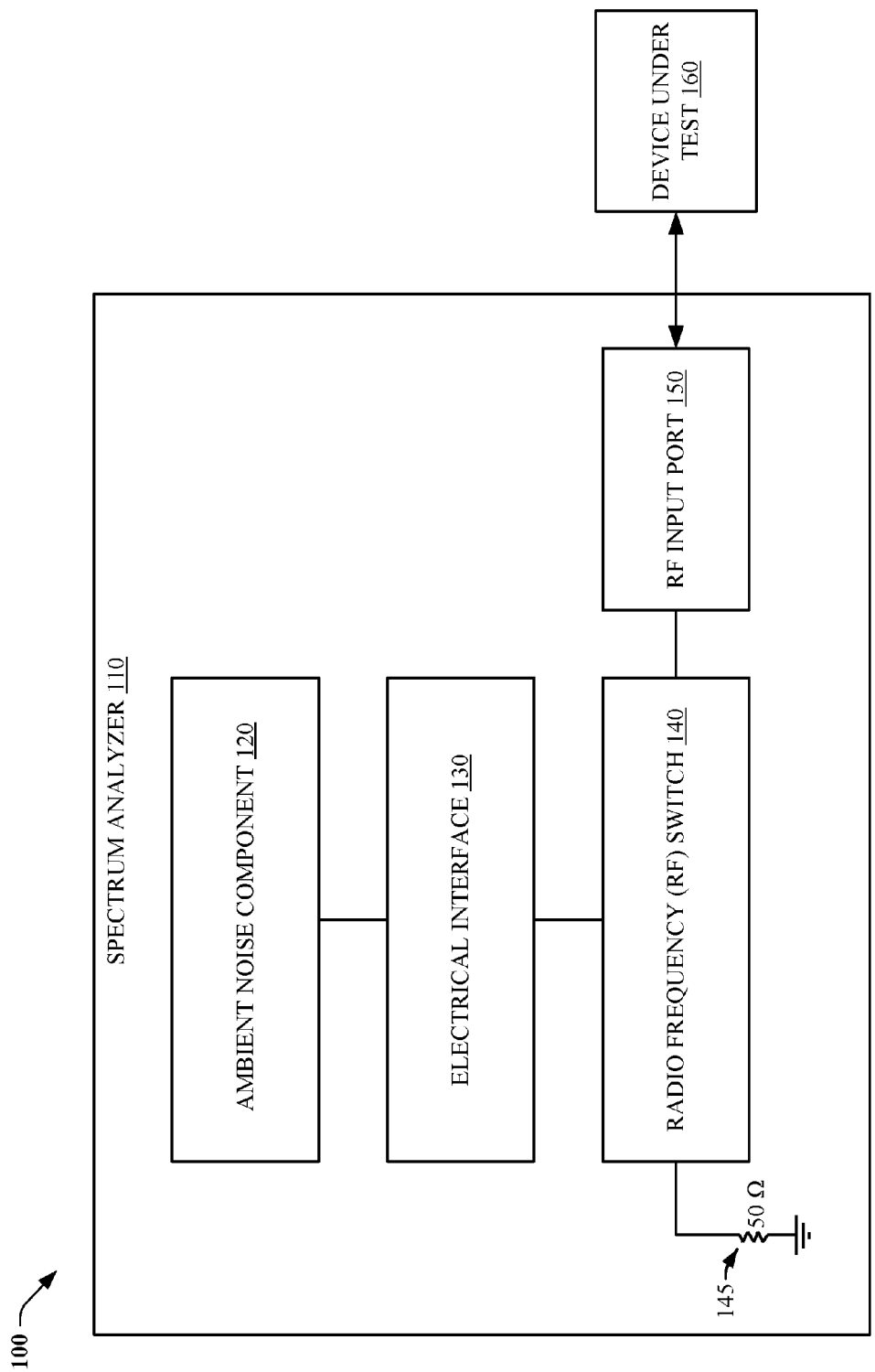
FIG. 1 illustrates a block diagram of an EMC testing environment, in accordance with various example embodiments.

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

As described above, conventional EMC testing technologies have had some drawbacks with respect to using specialized rooms, environments, etc. for performing EMC tests. Various embodiments disclosed herein can reduce EMC test costs by determining an ambient noise floor of a DUT test environment, and subtracting the ambient noise floor from DUT measurements to determine radiated and/or conducted emissions of the DUT, e.g., without using noise shielded testing rooms.

For example, a method can comprise: determining, by a system comprising a processor, e.g., a spectrum analyzer, via a radio frequency input port of the system, an ambient electromagnetic noise corresponding to the system; and in response to determining, by the system via the radio frequency input port, a radio frequency signature of a device under test, subtracting, by the system, the ambient electromagnetic noise from the radio frequency signature to obtain a normalized value representing an electromagnetic emission of the device under test.

In an embodiment, the method can comprise storing, by the system, an ambient noise value representing the ambient electromagnetic noise in a storage medium, e.g., memory, non-volatile memory, etc. of the system. Further, the method can comprise retrieving the ambient electromagnetic noise value from the storage medium, and subtracting the ambient electromagnetic noise value from the radio frequency signature to obtain the normalized value representing the electromagnetic emission of the device under test.

In another embodiment, the method can further comprise electronically coupling the radio frequency input port to the processor, e.g., central processing unit, using a radio frequency switch. In yet another embodiment, the method can comprise determining, via an antenna, e.g., passive antenna, wide band antenna, gain horn antenna, etc. that corresponds a frequency band under test and that has been connected to the radio frequency input port, the ambient electromagnetic noise corresponding to the system. Further, the method can comprise determining, via the antenna being connected to the radio frequency input port, a radiated electromagnetic characteristic of the device under test representing the radio frequency signature.

In one embodiment, the method can comprise determining, via a coaxial cable that has been connected to the radio frequency input port, the ambient electromagnetic noise corresponding to the system. Further, the method can comprise determining, via the coaxial cable being connected to the radio frequency input port and the device under test, a conducted electromagnetic characteristic of the device under test representing the radio frequency signature.

Another embodiment can comprise a system, e.g., spectrum analyzer, frequency measurement device, etc. comprising: a processor and a memory that stores executable instructions that, when executed by the processor, facilitate performance of operations, comprising: in response to receiving, during a first configuration of the system, e.g., during an ambient noise floor measurement configuration, a first input signal via a radio frequency port of the system, determining a noise floor of a measurement environment of the system; and in response to receiving, during a second configuration of the system via the radio frequency port, e.g., during a device under test frequency signature measurement configuration, a second input signal representing an electromagnetic characteristic of the device under test, subtracting the noise floor from the electromagnetic characteristic to obtain an electromagnetic emission of the device under test.

In an embodiment, the operations can further comprise storing a background noise value representing the noise floor in a storage medium of the system, retrieving the background noise value from the storage medium, and subtracting the background noise value from the electromagnetic characteristic to obtain the electromagnetic emission of the device under test.

In another embodiment, the operations can further comprise coupling the radio frequency port to an electrical interface coupled to the processor using a radio frequency switch. In yet another embodiment, an antenna can be connected to the input port, and the operations can comprise determining, using the antenna, the noise floor of the measuring environment of the system. Further, the operations can comprise receiving, using the antenna being connected to the input port, the second input signal, and determining a radiated characteristic of the device under test representing the electromagnetic characteristic based on the second input signal.

In one embodiment, a coaxial cable can be connected to the input port, and the operations can comprise determining, using the coaxial cable, the noise floor of the measurement environment of the system. Further, the operations can comprise receiving, using the coaxial cable being connected to the input port and the device under test, the second input signal, and determining a conducted characteristic of the device under test representing the electromagnetic characteristic based on the second input signal.

Another embodiment can comprise a machine-readable storage medium, comprising executable instructions that, when executed by a processor, facilitate performance of operations, comprising: electronically coupling an input port to an electrical interface communicatively coupled to the processor; determining, via the input port, background electromagnetic noise; and in response to determining, via the input port, an electromagnetic characteristic of a device under test, subtracting the background electromagnetic noise from the electromagnetic characteristic to obtain an electromagnetic emission of the device under test.

In yet another embodiment, the operations can further comprise storing a background noise value representing the background electromagnetic noise in a storage medium, retrieving the background noise value from the storage medium; and subtracting the background noise value from the electromagnetic noise characteristic to obtain the electromagnetic emission of the device under test.

In an embodiment, the determining the background electromagnetic noise comprises determining, using an antenna that has been connected to the input port, the background electromagnetic noise. Further, the determining the electromagnetic characteristic comprises determining, using the antenna that has been connected to the input port, a radiated electromagnetic characteristic of the device under test.

In another embodiment, the determining the background electromagnetic noise comprises determining, using a coaxial cable that has been connected to the input port, the background electromagnetic noise. Further, the determining the electromagnetic characteristic comprises determining, using the coaxial cable being connected to the input port and the device under test, a conducted electromagnetic characteristic of the device under test.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

As described above, conventional EMC testing technologies perform EMC tests within specialized testing rooms, e.g., inside a modified faraday cage generally lined with anechoic material. Such testing rooms need to be of sufficient physical size to house a DUT and test equipment, and must be capable of sufficiently blocking outside RF stimulus, or RF noise, from interfering with test results. In this regard, conventional EMC testing enclosures, RF shield rooms, etc. can be costly, require periodic maintenance, and require building space to house them. For example, periodic maintenance of RF shield rooms includes inspection and maintenance of door seals, structure bolts, signal feed-through panels, etc. Various embodiments described herein can detect radiated or conducted electromagnetic stimulus of a DUT during EMC testing, e.g., during pre-compliance testing by a developer of the DUT, without use of a specialized testing, screening, etc. room or semi-anechoic enclosure.

In this regard, and now referring to FIG. 1, spectrum analyzer 110 can be configured to measure, e.g., during EMC testing, spectral components of a signal detected from DUT 160, e.g., comprising dominant frequency, power, distortion, harmonics, bandwidth, etc.—without using a specialized test environment, e.g., RF screen room, semi-anechoic enclosure, etc. In one embodiment, DUT 160 can comprise a set-top box, e.g., corresponding to a satellite based digital television and/or communication service.

Figure 2:
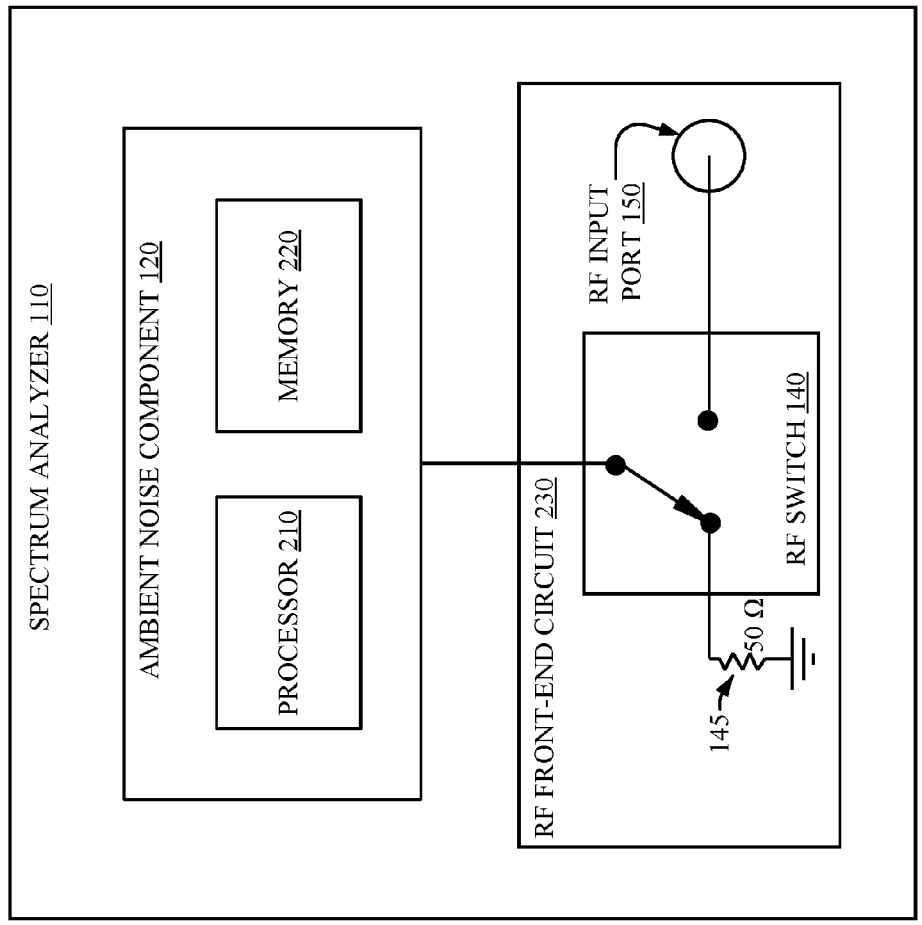
FIG. 2 illustrates a block diagram of an EMC testing environment for testing internal noise of a spectrum analyzer, in accordance with various example embodiments.

As illustrated by FIG. 2, in one embodiment, ambient noise component 120 can comprise processor 210, e.g., a central processing unit (CPU), digital signal processor, etc. and memory 220, e.g., volatile memory, non-volatile memory, etc. In this regard, memory 220 can store firmware, software, etc. comprising instructions that processor 210 can execute to perform operations for controlling, via electrical interface 130, RF switch 140 during respective operating modes, configurations, etc. of spectrum analyzer 110.

Further, electrical interface 130 can comprise RF front-end circuit 230, which can include RF switch 140, 50 ohm resistor 145, and RF input port 150. In this regard, as illustrated by FIG. 2, e.g., during a spectrum analyzer internal noise floor configuration, ambient noise component 120 can electronically couple RF switch 140 to 50 ohm resistor 145, and determine, via 50 ohm resistor 145, an internal RF noise of spectrum analyzer 110. Further, ambient noise component 120 can remove the internal RF noise from DUT 160 measurements, e.g., performed in other configurations (see below)—enabling ambient noise component 120 to detect DUT 160 signals at levels below an internal noise floor of spectrum analyzer 110. The internal noise floor is a measure of a signal created from the sum of all noise sources and unwanted signals within a measurement system, e.g., spectrum analyzer 110, in which a noise signal, noise, etc. is defined as any signal other than the one being monitored, e.g., for EMC testing. In this regard, ambient noise component 120 can remove the internal RF noise from DUT 160 measurements by subtracting the internal noise floor from the DUT 160 measurements.

Figure 3:
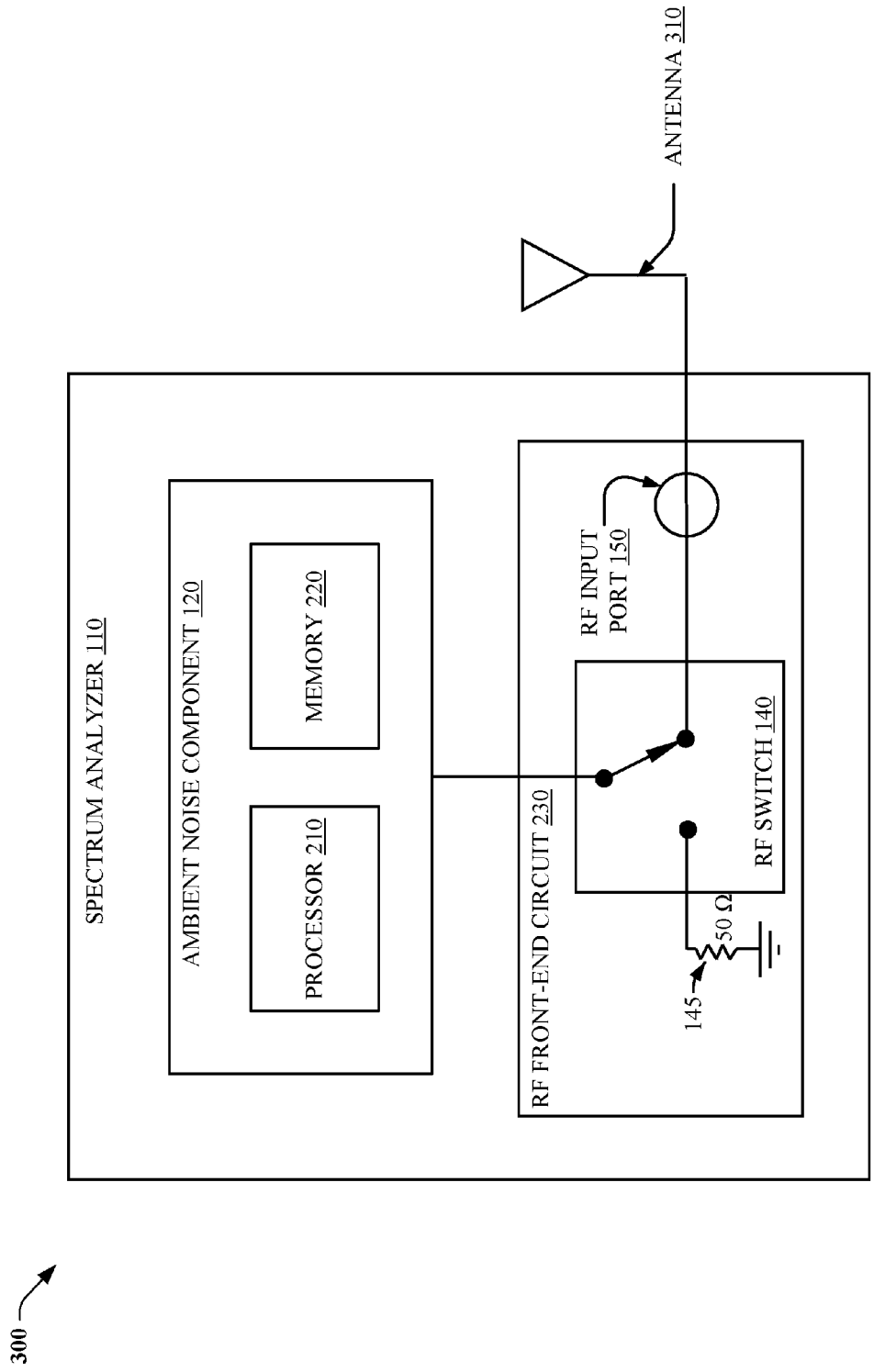
FIG. 3 illustrates a block diagram of an EMC testing environment for determining an ambient radiated noise floor, in accordance with various example embodiments.
Figure 4:
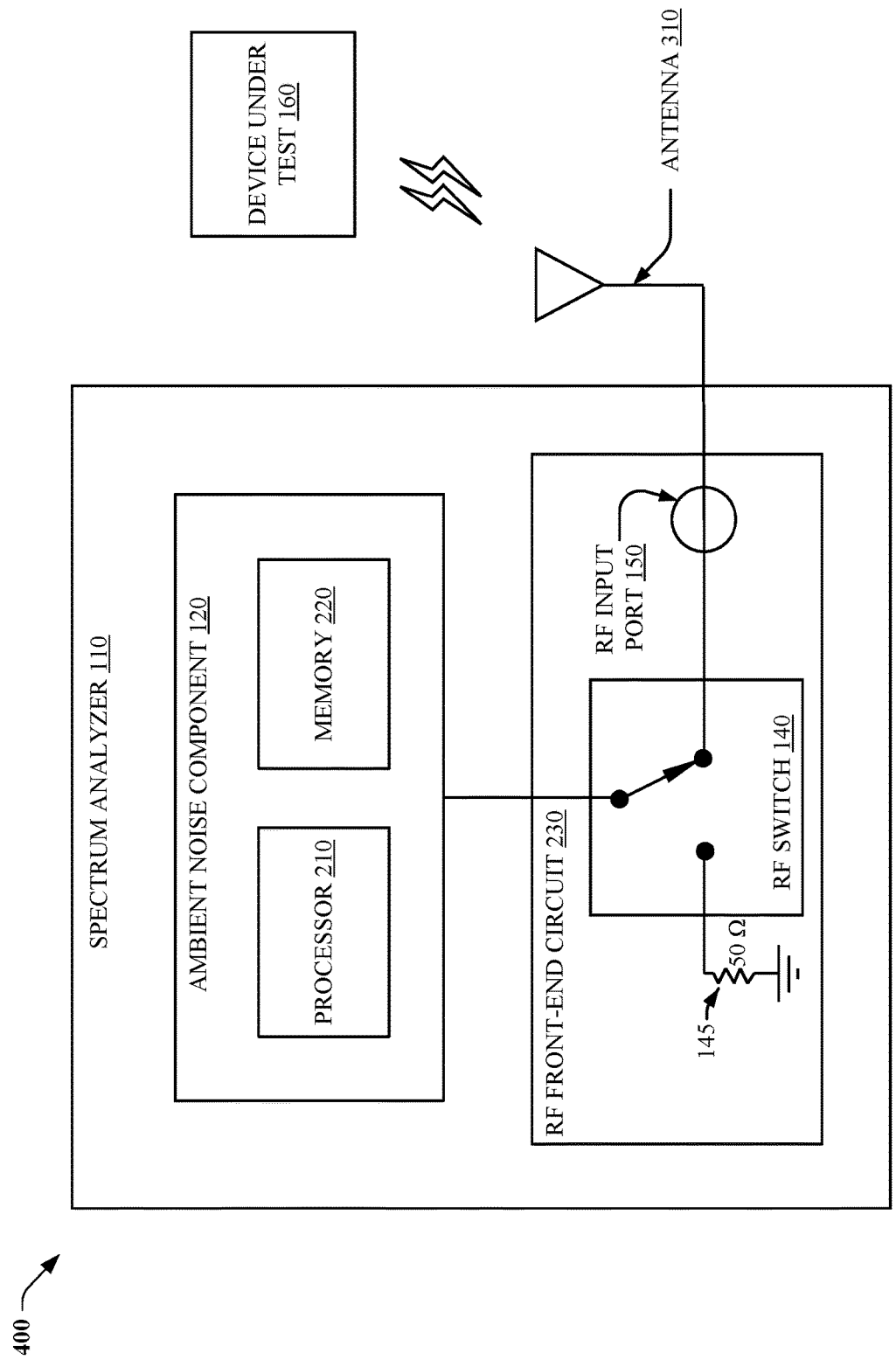
FIG. 4 illustrates a block diagram of an EMC testing environment for determining radiated emissions of a DUT, in accordance with various example embodiments.

Referring now to embodiments illustrated by FIGS. 3 and 4, e.g., corresponding to radiated emissions pre-compliance testing, ambient noise component 120 can determine, measure, etc. radiated electromagnetic emissions of DUT 160—without use of a shield room, enclosure, etc.

In this regard, e.g., during a first step of an ambient noise cancellation configuration corresponding to the radiated emissions pre-compliance testing, ambient noise component 120 can electronically couple RF switch 140 to RF input port 150. Further, ambient noise component 120 can request, via a user interface, e.g., user interface component 710 (see below), that antenna 310, e.g., a passive antenna, a wide band antenna, a gain horn antenna, etc., e.g., corresponding to a frequency band under test, be connected to RF input port 150. Further, ambient noise component 120 can verify whether antenna 310 has been connected to RF input port 150, e.g., before measuring an ambient noise floor of an EMC test environment comprising spectrum analyzer 110.

In this regard, the ambient noise floor is a measure of a signal created from the sum of all noise sources and unwanted signals within the EMC test environment comprising spectrum analyzer 110.

In one embodiment, ambient noise component 120 can automatically determine whether antenna 310 has been connected to RF input port 150 by measuring an electrical characteristic, e.g., impedance, of RF input port 150. For example, ambient noise component 120 can determine antenna 310 has been connected to RF input port 150 based on the electrical characteristic being determined to satisfy a defined impedance condition representing antenna 310 has been connected to RF input port 150. In another embodiment, ambient noise component 120 can request, via the user interface, that a user confirm antenna 310 has been connected to RF input port 150.

In response to determining that antenna 310 has been connected to RF input port 150, e.g., during a second step of the ambient noise cancellation configuration corresponding to the radiated emissions pre-compliance testing—in which DUT 160 has been removed from the EMC test environment and/or powered off—ambient noise component 120 can measure, determine, etc., via antenna 310, the ambient noise floor of the EMC test environment, e.g., a radiated emission test environment.

In this regard, after determining the ambient noise floor of the radiated emission test environment, and during a normalized spectral analysis configuration corresponding to the radiated emissions pre-compliance testing—in which DUT 160 has been included in the EMC test environment and powered on—ambient noise component 120 can receive, via antenna 130 being connected to RF input port 150, an input signal from DUT 160, and determine, based on the input signal, an electromagnetic characteristic, or radiated emission characteristic, of DUT 160. Further, ambient noise component 120 can subtract the ambient noise floor from the radiated emission characteristic of DUT 160 to determine, obtain, etc. a radiated electromagnetic emission of DUT 160—without use of the shield room, enclosure, etc.

Figure 5:
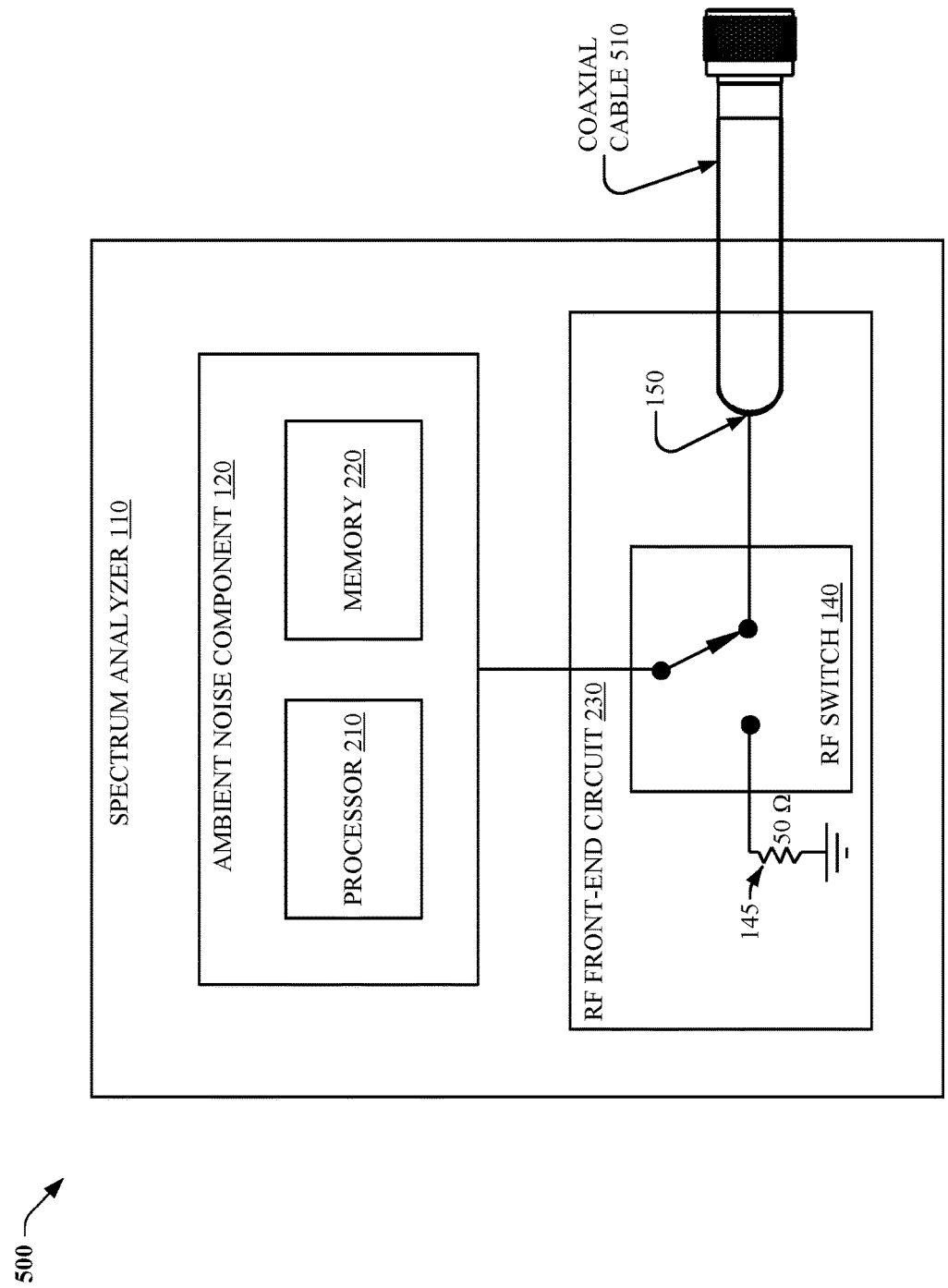
FIG. 5 illustrates a block diagram of an EMC testing environment for determining an ambient conducted noise floor, in accordance with various example embodiments.
Figure 6:
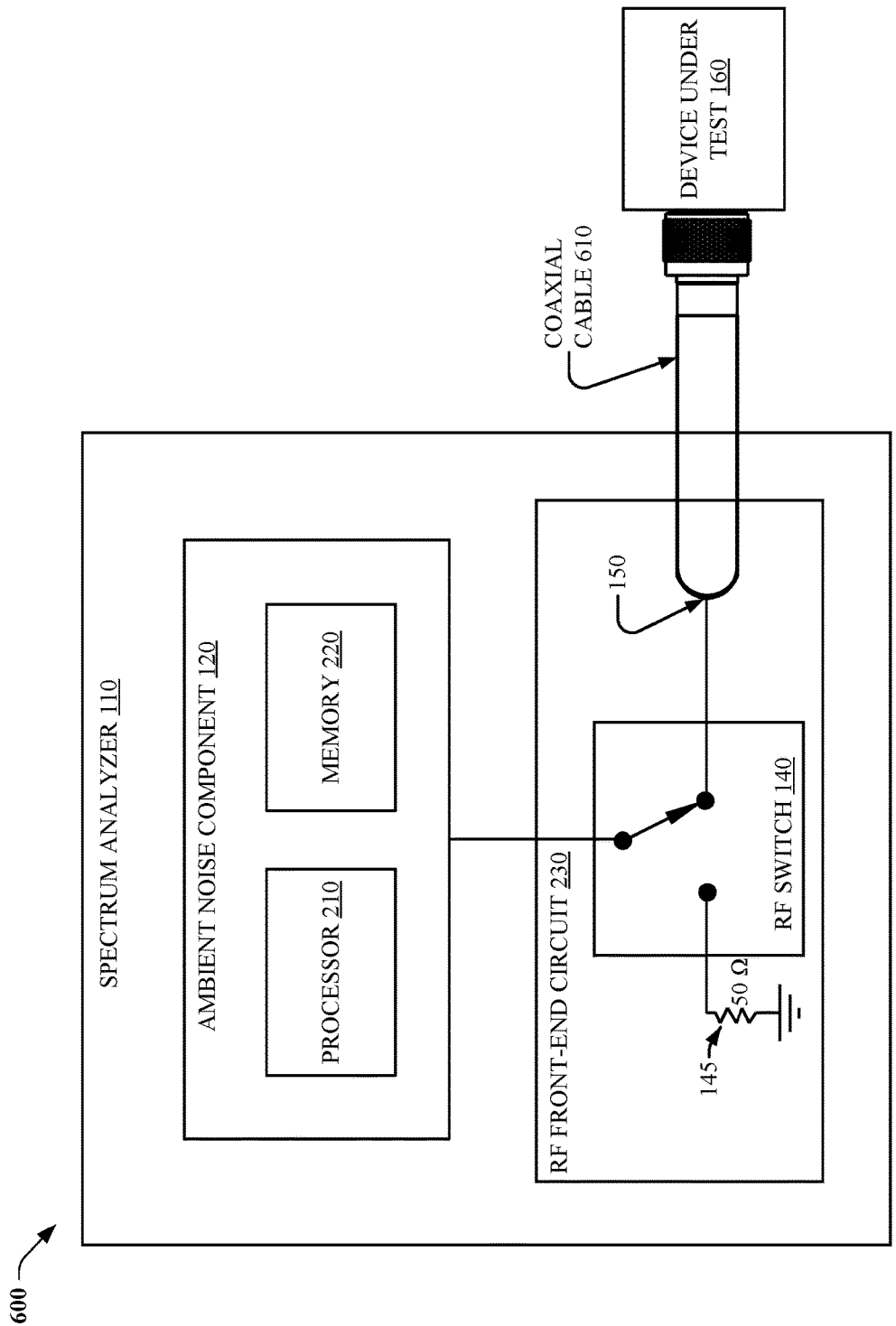
FIG. 6 illustrates a block diagram of an EMC testing environment for determining conducted emissions of a DUT, in accordance with various example embodiments.

Now referring to embodiments illustrated by FIGS. 5 and 6, e.g., corresponding to conducted emissions pre-compliance testing, ambient noise component 120 can determine, measure, etc. conducted electromagnetic emissions of DUT 160—without use of the shield room, enclosure, etc.

In this regard, and during a first step of an ambient noise cancellation configuration corresponding to the conducted emissions pre-compliance testing, ambient noise component 120 can electronically couple RF switch 140 to RF input port 150. Further, ambient noise component 120 can request, via the user interface, that coaxial cable 510 be connected to RF input port 150. Further, ambient noise component 120 can verify whether coaxial cable has been connected to RF input port 150, e.g., before measuring the ambient noise floor of the EMC test environment comprising spectrum analyzer 110.

In one embodiment, ambient noise component 120 can automatically determine whether coaxial cable 510 has been connected to RF input port 150 by measuring an electrical characteristic, e.g., impedance, of RF input port 150. For example, ambient noise component 120 can determine coaxial cable 510 has been connected to RF input port 150 based on the electrical characteristic being determined to satisfy a defined impedance condition representing coaxial cable 510 has been connected to RF input port 150. In another embodiment, ambient noise component 120 can request, via the user interface, that a user confirm coaxial cable 510 has been connected to RF input port 150.

In response to determining that coaxial cable 510 has been connected to RF input port 150, and during a second step of the ambient noise cancellation configuration corresponding to the conducted emissions pre-compliance testing—in which DUT 160 has been disconnected from coaxial cable 510 and removed from the EMC test environment and/or powered off—ambient noise component 120 can measure, determine, etc., via coaxial cable 510, the ambient noise floor of the EMC test environment, e.g., a conducted emission test environment.

In this regard, after determining the ambient noise floor of the conducted emission test environment, and during the normalized spectral analysis configuration corresponding to the conducted emissions pre-compliance testing—in which DUT 160 has been connected to coaxial cable 510 and powered on—ambient noise component 120 can receive, via coaxial cable 510 being connected to RF input port 150 and DUT 160, an input signal from DUT 160, and determine, based on the input signal, an electromagnetic characteristic, or conducted emission characteristic, of DUT 160. Further, ambient noise component 120 can subtract the ambient noise floor from the conducted emission characteristic of DUT 160 to determine, obtain, etc. a conducted electromagnetic emission of DUT 160—without use of the shield room, enclosure, etc.

Figure 7:
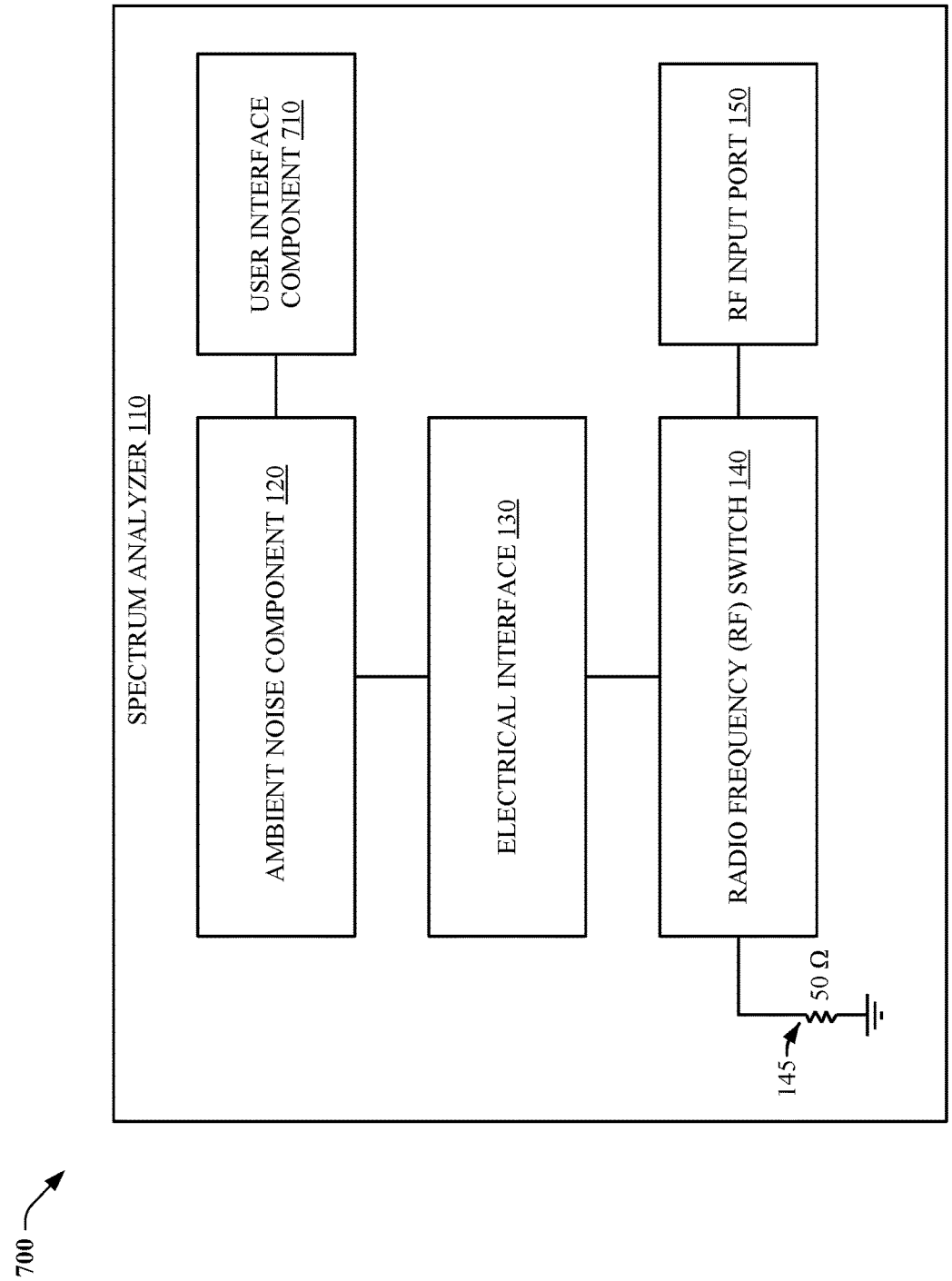
FIG. 7 illustrates a block diagram of an EMC testing device comprising a user interface component, in accordance with various example embodiments.

It should be appreciated by a person of ordinary skill in the art of signal measurement having the benefit of the instant disclosure that the first and second steps of the ambient noise cancellation configuration corresponding to the radiated/conducted emissions pre-compliance testing can be completed during an initialization procedure of spectrum analyzer 110. In this regard, and now referring to FIGS. 7 and 8, user interface component 710 can include display 810 for displaying information to a user, and can include configuration selection keys 820, menu keys 822, numeric keypad 824, and dial 830 for accepting information from the user.

Figure 8:
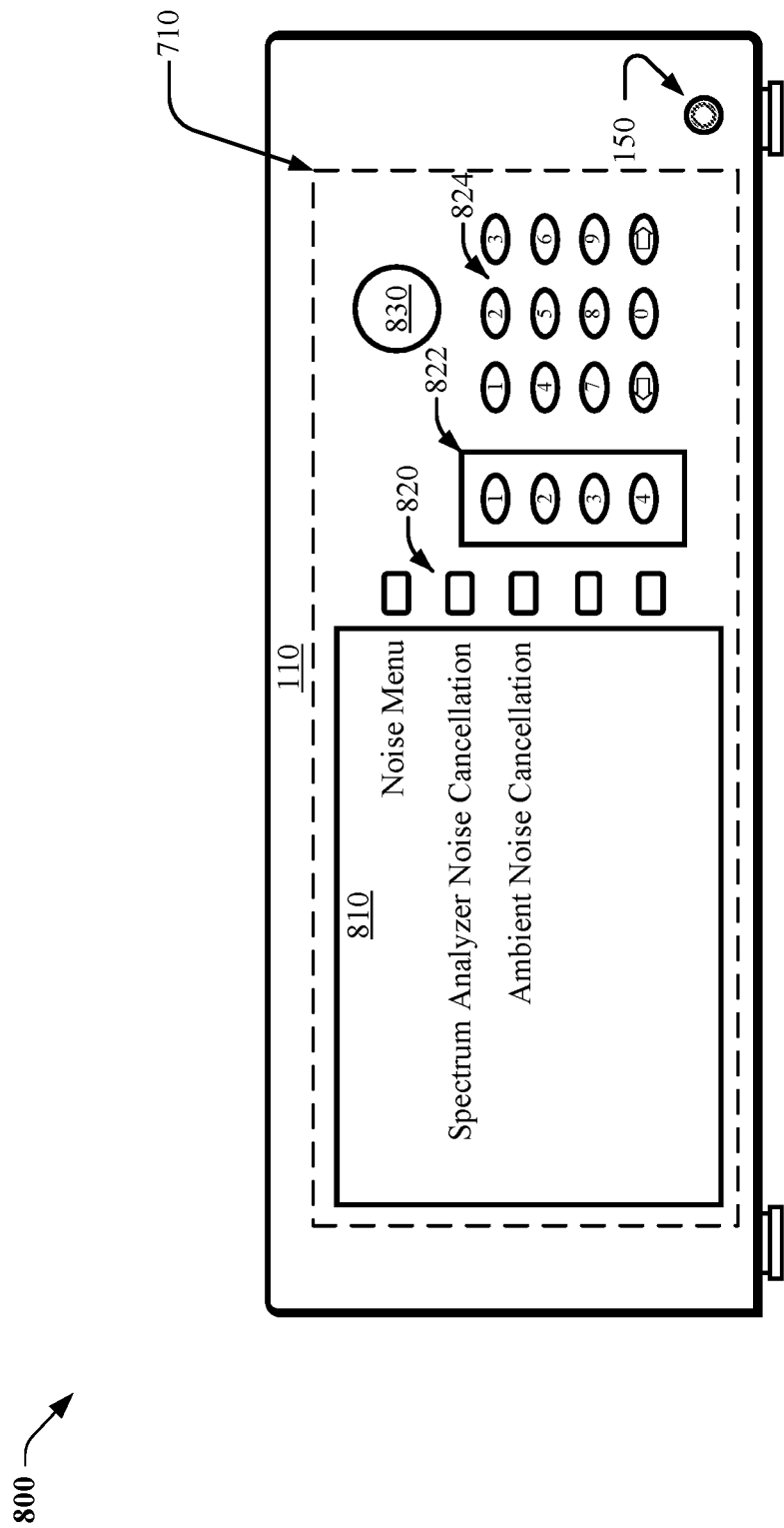
FIG. 8 illustrates another block diagram of an EMC testing device, in accordance with various example embodiments.

As illustrated by FIG. 8, in one embodiment, the user can initiate a display of a "Noise Menu" using menu keys 822.

Further, in response to detecting a selection of configuration selection keys 820 corresponding to "Spectrum Analyzer Noise Cancellation" being displayed on display 810, ambient noise component 120 can perform operations corresponding to the spectrum analyzer internal noise floor configuration, e.g., during an initialization of spectrum analyzer 110. Further, in an embodiment, after determining the internal RF noise generated by spectrum analyzer 110, ambient noise component 120 can store a value representing the internal RF noise in memory 220.

In another embodiment, in response to detecting a selection of configuration selection keys 820 corresponding to "Ambient Noise Cancelation" being displayed on display 810, ambient noise component 120 can perform operations corresponding to the ambient noise cancelation configuration, e.g., during the initialization of spectrum analyzer 110. Further, in an embodiment, after determining the ambient noise floor corresponding to the radiated/conducted emissions pre-compliance test environment, ambient noise component 120 can store a value representing the ambient noise floor in memory 220.

In this regard, in embodiment(s), ambient noise component 120 can utilize the stored values of the internal RF noise and the ambient noise floor to "normalize" emission measurements made during the normalized spectral analysis configuration, e.g., by retrieving the stored values of the internal RF noise and the ambient noise floor from memory 220, and subtracting the retrieved values from the electromagnetic characteristics of DUT 160 measured via RF input port 150.

In other embodiment(s), numeric keypad 824 and/or dial 830 can enable the user to enter information representing appropriate settings for spectrum analyzer 110 to determine the internal RF noise, the ambient noise floor, the radiated electromagnetic emissions of DUT 160, and/or the conducted electromagnetic emissions of DUT 160. For example, such information can comprise selection of a measurement band, input attenuation, sweep time, center frequency, frequency span, etc. Further, antenna 310 and coaxial cable 510 can be selected based on such information.

In one embodiment, user interface component 710 can be used to define sweep times, select whether multiple sweeps should be performed, e.g., in a max-hold mode of the spectrum analyzer, etc. to improve measurement accuracy, e.g., caused by uncertainty of non-repetitive signals detected by ambient noise component 120.

FIGS. 9-12 illustrate methodologies in accordance with the disclosed subject matter. For simplicity of explanation, the methodologies are depicted and described as a series of acts. It is to be understood and appreciated that the subject innovation is not limited by the acts illustrated and/or by the order of acts. For example, acts can occur in various orders and/or concurrently, and with other acts not presented or described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Figure 9:
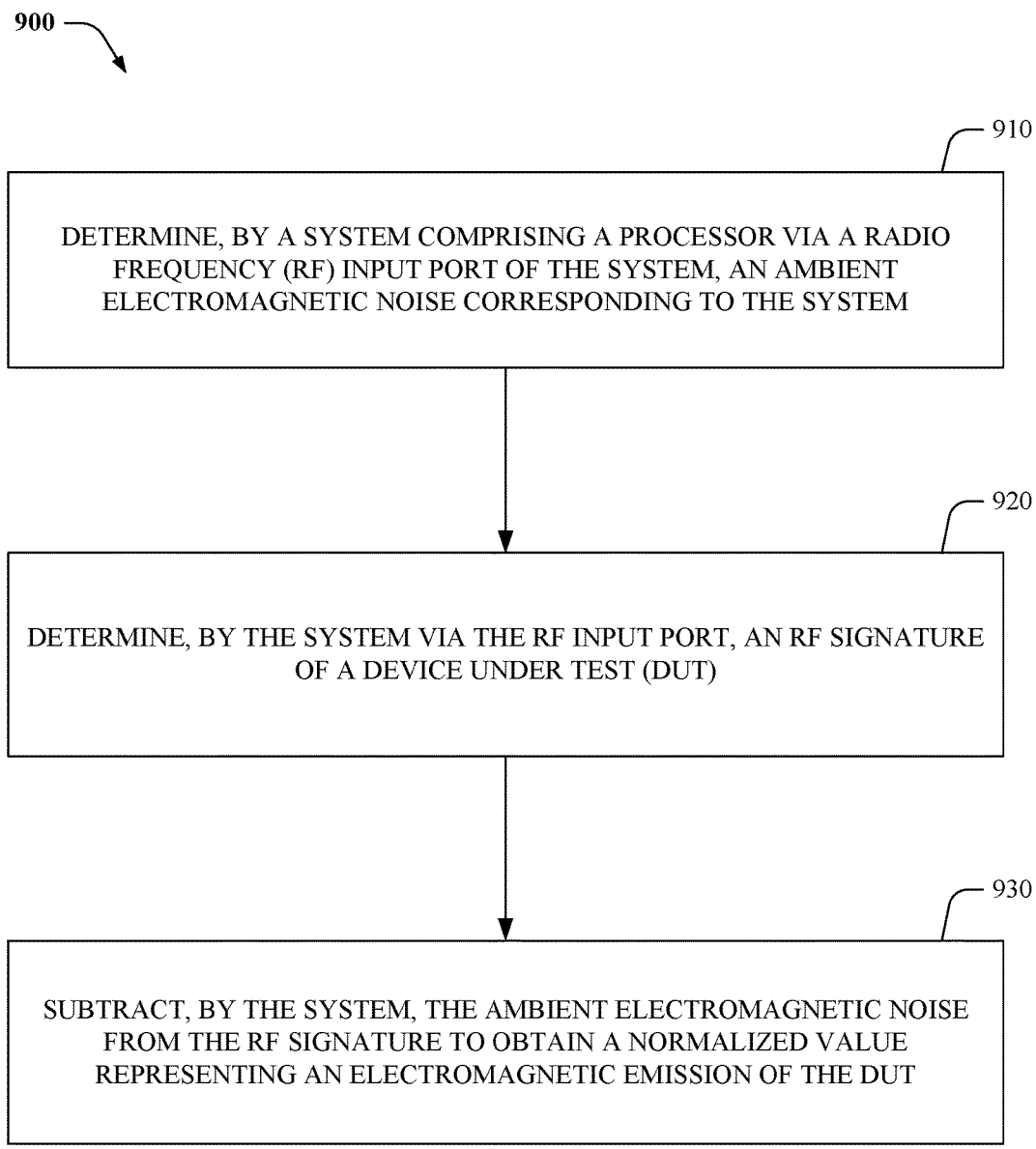
FIGS. 9-12 illustrate flow diagrams of methods associated with determining an ambient noise floor of an EMC testing environment, in accordance with various example embodiments.

Referring now to FIG. 9, a process (900) performed by spectrum analyzer 110, and/or by component(s) thereof, is illustrated, in accordance with various embodiments. At 910, an ambient electromagnetic noise corresponding to a system (e.g., 100) can be determined by the system via an RF input port of the system. At 920, an RF signature of a DUT can be determined by the system via the RF input port. At 930, the system can subtract the ambient electromagnetic noise from the RF signature to obtain a normalized value representing an electromagnetic emission of the DUT.

Figure 10:
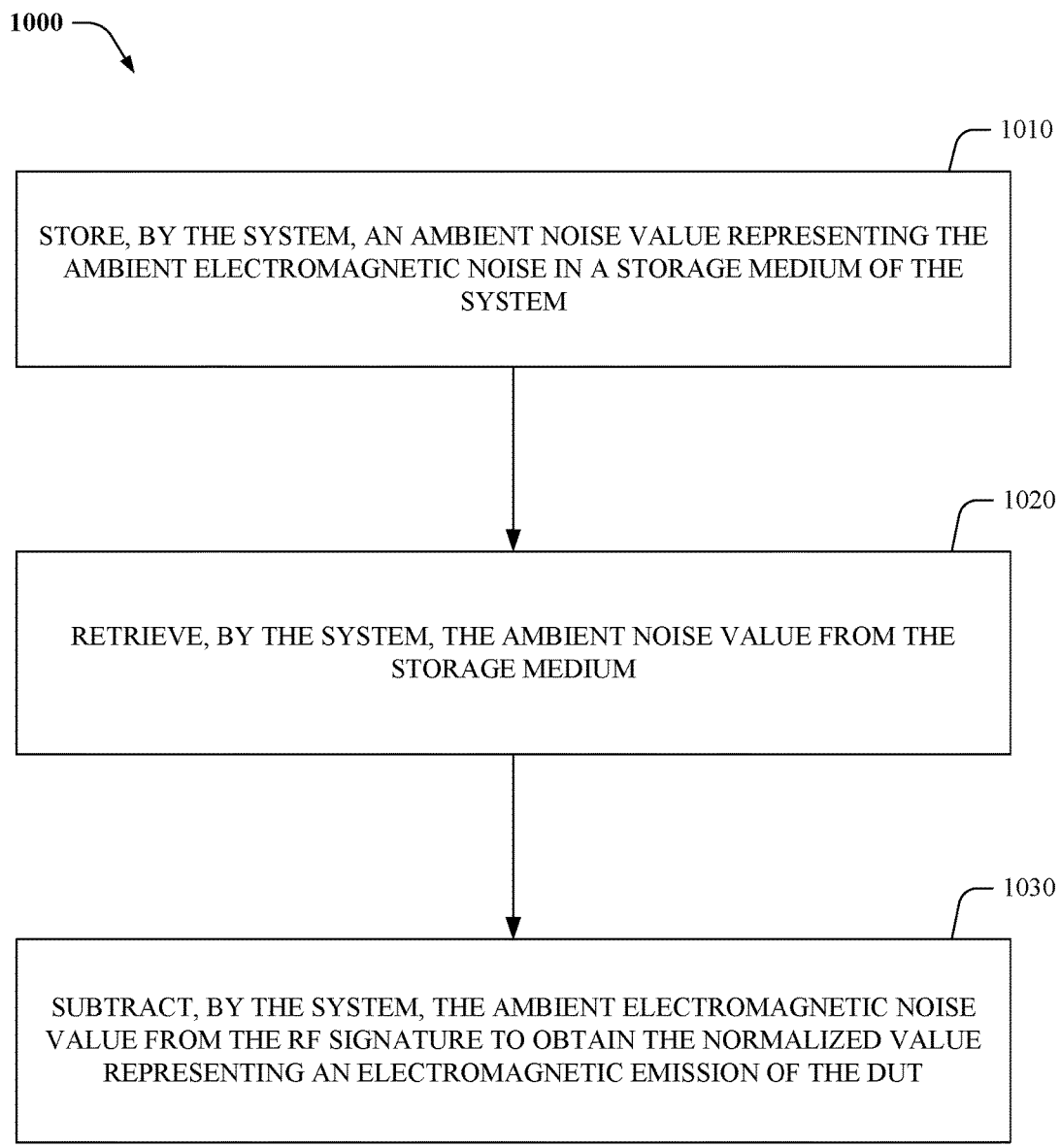

Now referring to FIG. 10, a process (1000) for obtaining a normalized value representing an electromagnetic emission of a DUT is illustrated, in accordance with various embodiments. At 1010, an ambient noise value representing the ambient electromagnetic noise corresponding to a system (e.g., 100) can be stored, by the system, in a storage medium of the system. At 1020, the ambient noise value can be retrieved, by the system, from the storage medium. At 1030, the ambient electromagnetic noise value can be subtracted, by the system, from the RF signature to obtain the normalized value representing the electromagnetic emission of the DUT.

Figure 11:
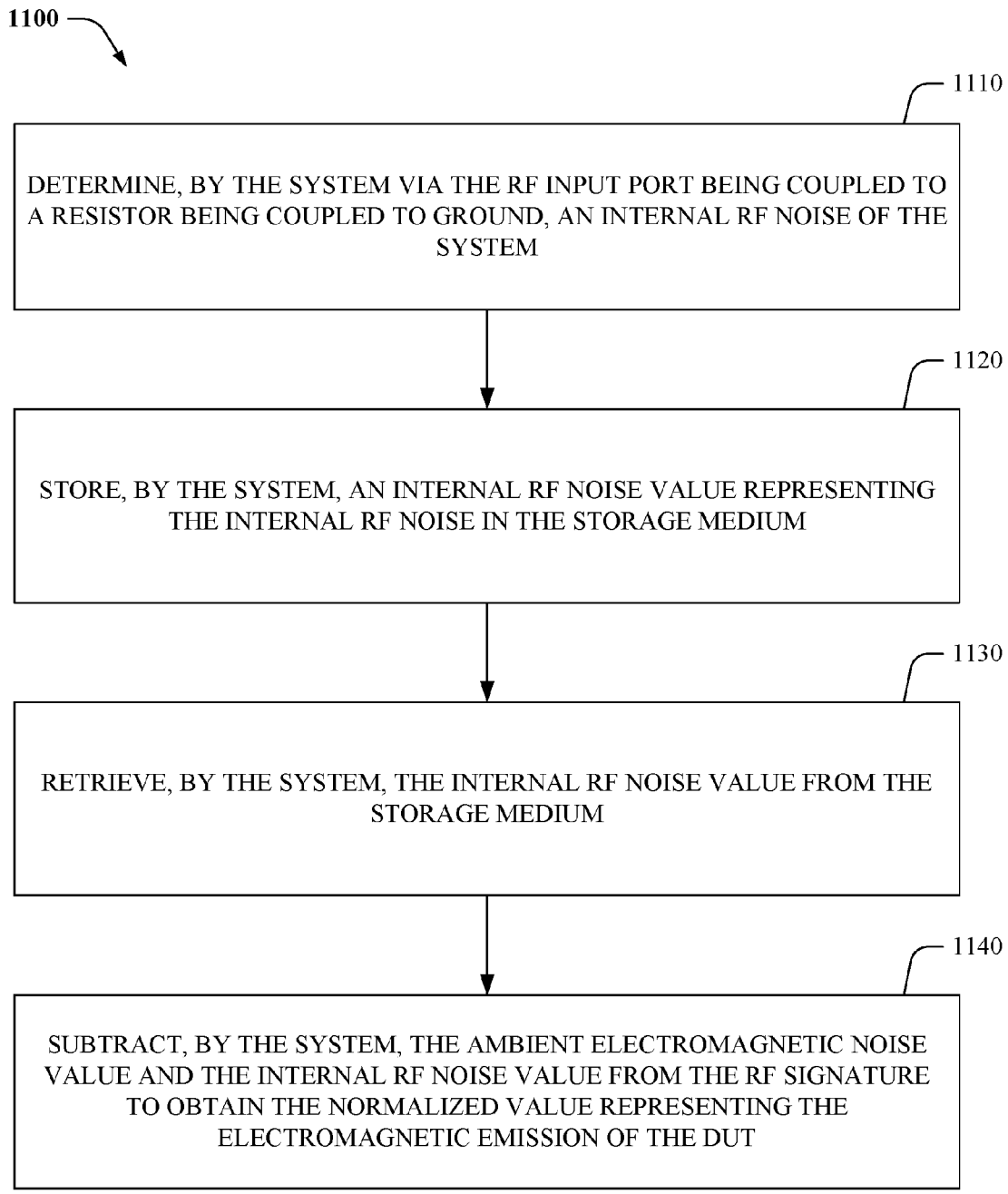

FIG. 11 illustrates another process (1100) for obtaining the normalized value representing the electromagnetic emission of the DUT, in accordance with various embodiments. At 1110, an internal RF noise of the system (e.g., 110) can be determined, by the system, via the RF input port being coupled to a resistor being coupled to ground. At 1120, an internal RF noise value representing the internal RF noise of the system can be stored, by the system, in the storage medium. At 1130, the internal RF noise value can be retrieved, by the system, from the storage medium. At 1140, the ambient electromagnetic noise value and the internal RF noise value can be subtracted, by the system, from the RF signature to obtain the normalized value representing electromagnetic emission of the DUT.

Figure 12:
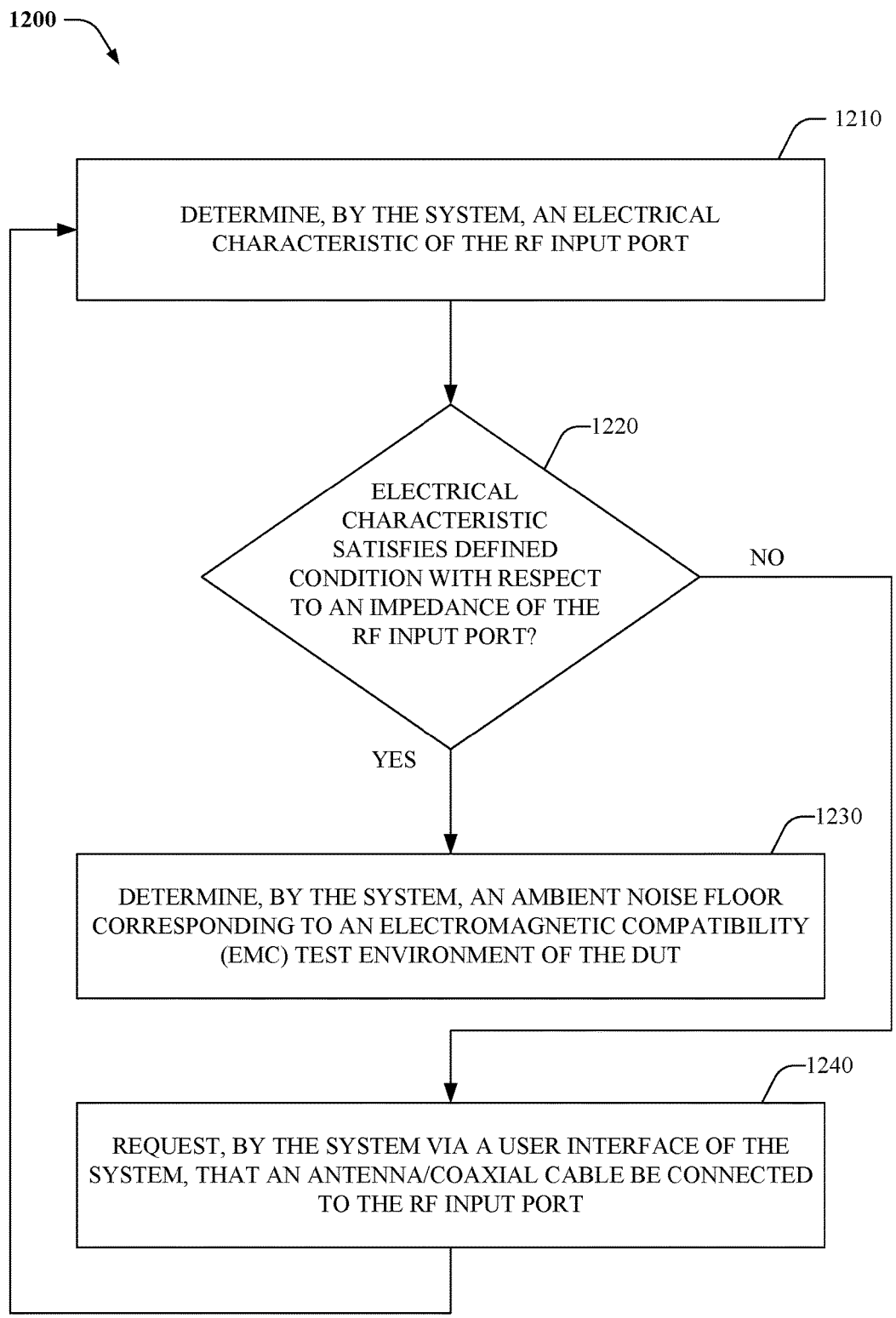

FIG. 12 illustrates a process for automatically determining whether an antenna and/or a coaxial cable has been connected to an RF input port of a system (e.g., 100), in accordance with various embodiments. At 1210, an electrical characteristic, e.g., an impedance, of the RF input port can be determined by the system. At 1220, it can be determined, by the system, whether the electrical characteristic satisfies a defined condition with respect to the impedance of the RF input port, e.g., whether the impedance of the RF input port corresponds to an antenna being connected to the RF input port, whether the impedance of the RF input port corresponds to a coaxial cable being connected to the RF input port, etc.

In response to the electrical characteristic being determined to satisfy the defined condition with respect to the impedance of the RF input port, flow continues to 1230, at which an ambient noise floor corresponding to an EMC test environment of the DUT can be determined by the system; otherwise flow continues to 1240, at which the system can request, via a user interface of the system, that an antenna or coaxial cable be connected to the RF input port. Further, flow continues from 1240 to 1210.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions and/or processes described herein. Processors can exploit nano-scale architectures such as, but not limited to, molecular and quantum-dot based transistors, switches and gates, in order to optimize space usage or enhance performance of mobile devices. A processor may also be implemented as a combination of computing processing units.

In the subject specification, terms such as "store," "data store," data storage," "storage medium", and substantially any other information storage component relevant to operation and functionality of a component and/or process, refer to "memory components," or entities embodied in a "memory," or components comprising the memory. It will be appreciated that the memory components described herein can be either volatile memory or nonvolatile memory, or can include both volatile and nonvolatile memory.

By way of illustration, and not limitation, nonvolatile memory, for example, can be included in memory 220. Further, nonvolatile memory can be included in read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

While the subject matter has been described above in the general context of computer-executable instructions of a computer program that runs on a computer and/or computers, those skilled in the art will recognize that the subject innovation also can be implemented in combination with other program modules. Generally, program modules include routines, programs, components, data structures, etc. that perform particular tasks and/or implement particular abstract data types.

Furthermore, to the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

As utilized herein, terms "component," "system," "interface," and the like are intended to refer to a computer-related entity, hardware, software (e.g., in execution), and/or firmware. For example, a component can be a processor, a process running on a processor, an object, an executable, a program, a storage device, and/or a computer. By way of illustration, an application running on a server and the server can be a component. One or more components can reside within a process, and a component can be localized on one computer and/or distributed between two or more computers.

Further, components can execute from various computer readable media having various data structures stored thereon. The components can communicate via local and/or remote processes such as in accordance with a signal having one or more data packets (e.g., data from one component interacting with another component in a local system, distributed system, and/or across a network, e.g., the Internet, with other systems via the signal).

As another example, a component can be an apparatus with specific functionality provided by mechanical parts operated by electric or electronic circuitry; the electric or electronic circuitry can be operated by a software application or a firmware application executed by one or more processors; the one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Aspects of systems, apparatus, and processes explained herein can constitute machine-executable instructions embodied within a machine, e.g., embodied in a computer readable medium (or media) associated with the machine. Such instructions, when executed by the machine, can cause the machine to perform the operations described. Additionally, the systems, processes, process blocks, etc. can be embodied within hardware, such as an application specific integrated circuit (ASIC) or the like. Moreover, the order in which some or all of the process blocks appear in each process should not be deemed limiting. Rather, it should be understood by a person of ordinary skill in the art having the benefit of the instant disclosure that some of the process blocks can be executed in a variety of orders not illustrated.

Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art.

The disclosed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, computer-readable carrier, or computer-readable media. For example, computer-readable media can include, but are not limited to, magnetic storage devices, e.g., hard disk; floppy disk; magnetic strip(s); optical disk (e.g., compact disk (CD), digital video disc (DVD), Blu-ray Disc (BD)); smart card(s); and flash memory device(s) (e.g., card, stick, key drive); and/or a virtual device that emulates a storage device and/or any of the above computer-readable media.

Artificial intelligence based systems, e.g., utilizing explicitly and/or implicitly trained classifiers, can be employed in connection with performing inference and/or probabilistic determinations and/or statistical-based determinations as in accordance with one or more aspects of the disclosed subject matter as described herein. For example, an artificial intelligence system can be used, via ambient noise component 120, to automatically determine whether an antenna/coaxial cable has been connected to an RF input port of a spectrum analyzer.

A classifier can be a function that maps an input attribute vector, x=(x1, x2, x3, x4, xn), to a confidence that the input belongs to a class, that is, f(x)=confidence (class). Such classification can employ a probabilistic and/or statistical-based analysis (e.g., factoring into the analysis utilities and costs) to infer an action that a user desires to be automatically performed. In the case of communication systems, for example, attributes can be information received from access points, servers, components of a wireless communication network, etc., and the classes can be categories or areas of interest (e.g., levels of priorities). A support vector machine is an example of a classifier that can be employed. The support vector machine operates by finding a hypersurface in the space of possible inputs, which the hypersurface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and probabilistic classification models providing different patterns of independence can be employed. Classification as used herein can also be inclusive of statistical regression that is utilized to develop models of priority.

In accordance with various aspects of the subject specification, artificial intelligence based systems, components, etc. can employ classifiers that are explicitly trained, e.g., via a generic training data, etc. as well as implicitly trained, e.g., via observing characteristics of communication equipment, e.g., a gateway, wireless communication device, etc., receiving reports from such communication equipment, receiving operator preferences, receiving historical information, receiving extrinsic information, etc. For example, support vector machines can be configured via a learning or training phase within a classifier constructor and feature selection module. Thus, the classifier(s) can be used by an artificial intelligence system to automatically learn and perform a number of functions, e.g., performed by ambient noise component 120.

As used herein, the term "infer" or "inference" refers generally to the process of reasoning about, or inferring states of, the system, environment, user, and/or intent from a set of observations as captured via events and/or data. Captured data and events can include user data, device data, environment data, data from sensors, sensor data, application data, implicit data, explicit data, etc. Inference can be employed to identify a specific context or action, or can generate a probability distribution over states of interest based on a consideration of data and events, for example.

Inference can also refer to techniques employed for composing higher-level events from a set of events and/or data. Such inference results in the construction of new events or actions from a set of observed events and/or stored event data, whether the events are correlated in close temporal proximity, and whether the events and data come from one or several event and data sources. Various classification schemes and/or systems (e.g., support vector machines, neural networks, expert systems, Bayesian belief networks, fuzzy logic, and data fusion engines) can be employed in connection with performing automatic and/or inferred action in connection with the disclosed subject matter.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A method, comprising:
    determining, by a system comprising a processor via a radio frequency input port of the system, an ambient electromagnetic noise corresponding to the system;
    in response to the determining the ambient electromagnetic noise, determining, by the system, via the radio frequency input port, a radio frequency signature of a device under test;
    generating, by the system, request data, representative of a request that an antenna be connected to the radio frequency input port, to be displayed by a user interface of the system; and
    subtracting, by the system, the ambient electromagnetic noise from the radio frequency signature to obtain a normalized value representative of an electromagnetic emission of the device under test.

2. The method of claim 1, further comprising:
    storing, by the system, an ambient noise value representing the ambient electromagnetic noise in a storage medium of the system, wherein the subtracting comprises:
    retrieving the ambient electromagnetic noise value from the storage medium; and
    subtracting the ambient electromagnetic noise value from the radio frequency signature to obtain the normalized value representing the electromagnetic emission of the device under test.

3. The method of claim 1, further comprising:
    electronically coupling the radio frequency input port to the processor using a radio frequency switch.

4. The method of claim 1, wherein the antenna has been connected to the radio frequency input port, and wherein the determining the ambient electromagnetic noise comprises determining, via the antenna, the ambient electromagnetic noise corresponding to the system.

5. The method of claim 4, wherein the determining the radio frequency signature of the device under test comprises determining, via the antenna, a radiated electromagnetic characteristic of the device under test representing the radio frequency signature of the device under test.

6. The method of claim 1, wherein a coaxial cable has been connected to the radio frequency input port, and wherein the determining the ambient electromagnetic noise comprises determining, via the coaxial cable, the ambient electromagnetic noise corresponding to the system.

7. The method of claim 6, wherein the coaxial cable has been connected between the radio frequency input port and the device under test, and wherein the determining the radio frequency signature of the device under test comprises determining, via the coaxial cable, a conducted electromagnetic characteristic of the device under test representing the radio frequency signature of the device under test.

8. A system, comprising:
a processor; and
a memory that stores executable instructions that, when executed by the processor, facilitate performance of operations, comprising:
determining via a radio frequency input port of the system, an ambient electromagnetic noise corresponding to the system;
based on the determining the ambient electromagnetic noise, determining, via the radio frequency input port, a radio frequency signature associated with a device under a test;
in response to the determining the radio frequency signature, generating request data, representative of a request that an antenna be connected to the radio frequency input port, to be displayed by a user interface of the system; and
based on a subtraction process associated with the ambient electromagnetic noise and the radio frequency signature, obtaining a normalized value representative of an electromagnetic emission of the device under the test.

9. The system of claim 8, wherein the radio frequency signature comprises the electromagnetic emission of the device under test.

10. The system of claim 8, wherein the operations further comprise:
coupling the radio frequency input port to an electrical interface coupled to the processor using a radio frequency switch.

11. The system of claim 8, wherein the operations further comprise:
determining, using the antenna, a noise floor associated with the ambient electromagnetic noise of a measuring environment of the system.

12. The system of claim 11, wherein a coaxial cable has been connected to the radio frequency input port, and wherein the determining the noise floor comprises determining, using the coaxial cable, the noise floor of the measuring environment of the system.

13. The system of claim 12, wherein the operations further comprise:

receiving, using the coaxial cable, a first input signal; and
based on a second input signal, determining a conducted characteristic of the device under test, representing the electromagnetic emission of the device under test.

14. The system of claim 8, wherein the operations further comprise:
in response to receiving an input signal, determining a radiated characteristic of the device under test, representing the electromagnetic emission of the device under test.

15. A machine-readable storage medium, comprising executable instructions that, when executed by a processor, facilitate performance of operations, comprising:
facilitating determining an ambient electromagnetic noise via a radio frequency input port of a system;
based on the facilitating the determining the ambient electromagnetic noise, determining a radio frequency signature associated with a device;
in response to the determining the radio frequency signature associated with the device, generating prompt data, representative of a prompt to connect an antenna to the radio frequency input port, to be displayed by a user interface of the system; and
subtracting the ambient electromagnetic noise from the radio frequency signature to obtain a normalized value representative of an electromagnetic emission of the device under a test.

16. The machine-readable storage medium of claim 15, wherein the operations further comprise:
generating a background noise value representative of a background electromagnetic noise; and
subtracting the background noise value from the radio frequency signature to obtain the electromagnetic emission of the device under test.

17. The machine-readable storage medium of claim 16, wherein the generating the background noise value comprises determining that the antenna has been connected to the radio frequency input port.

18. The machine-readable storage medium of claim 16, wherein the generating the background noise value comprises determining, using a coaxial cable that has been connected to the frequency input port, the ambient electromagnetic noise.

19. The machine-readable storage medium of claim 15, wherein the operations further comprise:
determining, using the antenna, a radiated electromagnetic characteristic of the device under test.

20. The machine-readable storage medium of claim 19, wherein the determining the radiated electromagnetic characteristic comprises determining, using a coaxial cable, a conducted electromagnetic characteristic of the device under test.

* * * * *